(12) United States Patent
Lee et al.

(10) Patent No.: US 7,786,520 B2
(45) Date of Patent: Aug. 31, 2010

(54) EMBEDDED SEMICONDUCTOR DEVICE INCLUDING PLANARIZATION RESISTANCE PATTERNS AND METHOD OF MANUFACTURING THE SAME

(75) Inventors: Se-young Lee, Suwon-si (KR); Il-young Yoon, Hwaseong-si (KR); Boung-ju Lee, Suwon-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 225 days.

(21) Appl. No.: 11/833,098

(22) Filed: Aug. 2, 2007

(65) Prior Publication Data
US 2008/0079049 A1 Apr. 3, 2008

(30) Foreign Application Priority Data
Aug. 25, 2006 (KR) ............... 10-2006-0081264

(51) Int. Cl.
*H01L 29/92* (2006.01)
(52) U.S. Cl. .................... 257/296; 257/E29.342; 257/303
(58) Field of Classification Search ......... 257/296–301, 257/303, E29.342
See application file for complete search history.

(56) References Cited

U.S. PATENT DOCUMENTS

| | | | | |
|---|---|---|---|---|
| 6,798,005 | B2 * | 9/2004 | Kimura et al. | 257/296 |
| 7,554,147 | B2 * | 6/2009 | Asano et al. | 257/296 |
| 2001/0046737 | A1 * | 11/2001 | Ahn et al. | 438/253 |
| 2004/0129963 | A1 * | 7/2004 | Amo et al. | 257/296 |
| 2004/0183111 | A1 * | 9/2004 | Shinkawata | 257/296 |
| 2004/0183112 | A1 * | 9/2004 | Okita | 257/296 |
| 2004/0232462 | A1 * | 11/2004 | Takeuchi | 257/296 |
| 2006/0006441 | A1 * | 1/2006 | Park et al. | 257/296 |

FOREIGN PATENT DOCUMENTS

JP 2005-347334 12/2005

(Continued)

OTHER PUBLICATIONS

English Abstract Publication No. 1020000020577.

(Continued)

*Primary Examiner*—Nathan W Ha
(74) *Attorney, Agent, or Firm*—F. Chau & Associates, LLC

(57) ABSTRACT

An embedded semiconductor device which a logic region and the memory region are planarized with planarization resistance patterns and a method of manufacturing the same are disclosed. The embedded semiconductor device includes a substrate, gates formed on the substrate, source/drain regions formed on both sides of the gates in the substrate, a first interlayer dielectric (ILD) layer which covers the gates and the source/drain regions, first via plugs which vertically penetrate the first ILD layer and are selectively connected to the source/drain regions, capacitors and second via plugs selectively connected to the first via plugs, a second ILD layer that fills the space between the capacitors and the second via plugs, planarization resistance patterns formed on the second ILD layer, a third ILD layer formed on the second ILD layer and the planarization resistant patterns, and third via plugs which vertically penetrate the third ILD layer, and are selectively connected to a top electrode of the capacitors and the second via plugs.

7 Claims, 14 Drawing Sheets

FOREIGN PATENT DOCUMENTS

| | | |
|---|---|---|
| KR | 2000-0020577 | 4/2000 |
| KR | 1020000020577 | 4/2000 |
| KR | 2000-0066946 | 11/2000 |
| KR | 1020000066946 | 11/2000 |
| KR | 1020010054734 | 7/2001 |
| KR | 1020010059741 | 7/2001 |
| KR | 1020030033697 | 5/2003 |

OTHER PUBLICATIONS

English Abstract Publication No. 1020000066946.

Korean Notice of Allowance dated Nov. 12, 2007; Sep. 5, 2007-060349634.

English Abstract for Publication No. 1020000020577.

English Abstract for Publication No. 1020000066946.

English Abstract for Publication No. 1020010054734.

English Abstract for Publication No. 1020010059741.

English Abstract for Publication No. 2005-347334.

English Abstract for Publication No. 1020030033697.

* cited by examiner

EMBEDDED SEMICONDUCTOR DEVICE INCLUDING PLANARIZATION RESISTANCE PATTERNS AND METHOD OF MANUFACTURING THE SAME

CROSS REFERENCE TO RELATED APPLICATION

This application claims priority from Korean Patent Application No. 10-2006-0081264 filed on Aug. 25, 2006, in the Korean Intellectual Property Office, the disclosure of which is incorporated herein by reference in its entirety.

BACKGROUND OF THE INVENTION

1. Field of the Invention

The present invention relates to a merged memory with logic (MML) semiconductor device or an embedded semiconductor device that integrates a logic device and a memory device into a single chip. More particularly, the present invention relates to an MML semiconductor device and a method of manufacturing the same which a logic area and a memory area planarized at the same height as planarization resistant patterns.

2. Description of Related Art

The MML semiconductor device or the embedded semiconductor device is a semiconductor device that integrates a logic function to perform signal operations and a memory function to store data. Since the MML semiconductor device has a shorter data transfer time and a lower power consumption than a multi-chip semiconductor device which combines a memory device and a logic device in a single package, it is typically implemented in systems that need high speed, low power, and a small footprint.

However, the MML semiconductor devices are relatively difficult to manufacture compared to other semiconductor devices since two different structures need to be manufactured into a single chip. Logic devices are formed based on various circuits that are composed of a significant number of transistors, via plugs, and signal transfer lines. Logic devices neither require a large number of capacitors, nor large volume capacitors. Thus, the size of capacitors tends to be small. However, semiconductor memory devices not only need a large number of transistors to store data, and but also large-sized capacitors. For example, DRAM devices include large capacitors. Therefore, when manufacturing the MML device that integrates logic devices and memory devices into a single chip, the manufacturing processes for the two types of devices are unlikely to be exchangeable as the methods and steps are different from each other. Therefore, in order to manufacture the MML semiconductor device, manufacturing processes are needed that can be used for the both device regions while achieving process stability. For example, in a process that has non-identical layers for each device capacitor, a height of the memory region may be several thousand Å, whereas the capacitors of the logic region are formed to a height of several hundred Å, or are not formed. A planarization process and a process to form via plugs can be unstable due to the height difference, and this can be a disadvantage when manufacturing the MML semiconductor device.

SUMMARY OF THE INVENTION

According to an embodiment of the present invention, there is provided an MML semiconductor device including a substrate, gates formed on the substrate, a source region and a drain region formed on respective sides of the gates in the substrate, a first interlayer dielectric (ILD) layer which covers the gates and the source/drain regions, first via plugs which vertically penetrate the first ILD layer and are selectively connected to the source/drain regions, capacitors and second via plugs selectively connected to the first via plugs, a second ILD layer filling the space between the capacitors and the second via plugs, planarization resistance patterns formed on the second ILD layer, a third ILD layer formed on the second ILD layer and the planarization resistant patterns, and third via plugs which vertically penetrate the third ILD layer and are selectively connected to a top electrode of the capacitors and the second via plugs.

The capacitors each comprise a bottom electrode, a dielectric layer, and the top electrode, the bottom electrode has a same height as the second ILD layer, and the dielectric layer and the top electrode can be extended on the second ILD layer.

The substrate includes a memory region and a logic region, wherein the capacitors can be formed in the memory region, and the planarization resistance patterns can be formed in the logic region.

The planarization resistance patterns can be formed having multiple layers, the planarization resistance patterns can include an upper resistance pattern formed of the same material as the top electrode of the capacitors. A capping layer of the planarization resistance pattern can be formed on the upper resistance pattern.

The capping layer of the planarization resistance pattern can be extended on the second ILD layer.

The planarization resistance patterns can include a lower resistance pattern formed of the same material as the dielectric layer of the capacitors.

The third via plugs can be separated from the planarization resistance patterns by a distance about equal to a horizontal width of the third via plugs.

A capacitor capping layer can be formed on the top electrode of the capacitors.

Silicide regions can be formed at a contact region of the source/drain regions and the first via plugs.

The silicide regions can be formed on the substrate or in the substrate.

The via plugs can include a liner layer at an interface between the via plugs and the ILD layer.

The liner layer can be formed of a metal or a metal compound.

According to another embodiment of the present invention, a method of fabricating an MML semiconductor device includes forming gates on a substrate including a memory region and a logic region, forming a source region and a drain region on respective sides of the gates in the substrate, forming a first interlayer dielectric (ILD) layer which covers the gates, forming first via plugs which vertically penetrate the first ILD layer, selectively connected to the source/drain regions, forming a second ILD layer on the first via plugs and the first ILD layer, forming capacitors which vertically penetrate the second ILD layer, selectively connecting the first via plugs, and including a bottom electrode, a capacitor dielectric layer, and a top electrode, wherein the part of the top electrode and the capacitor dielectric layer are extended on the second ILD layer, selectively forming planarization resistance patterns on the second ILD layer in the logic region while simultaneously forming the capacitors in the memory region, forming a third ILD layer on the capacitors and the planarization resistance patterns, planarizing the third ILD layer, forming second via plugs which vertically penetrate the third ILD layer and the second ILD layer and which are selectively connected to the first via plugs, and forming a third via plug which vertically penetrates the third ILD layer and which is connected to the top electrode of the capacitors.

The bottom electrode of the capacitor can be formed to substantially a height of the second ILD layer, and the capacitor dielectric layer and the top electrode can be extended on the second ILD layer.

BRIEF DESCRIPTION OF THE DRAWINGS

The present invention will become apparent by describing in detail exemplary embodiments thereof with reference to the attached drawings in which.

DETAILED DESCRIPTION OF EXEMPLARY EMBODIMENTS

Figure 1A:
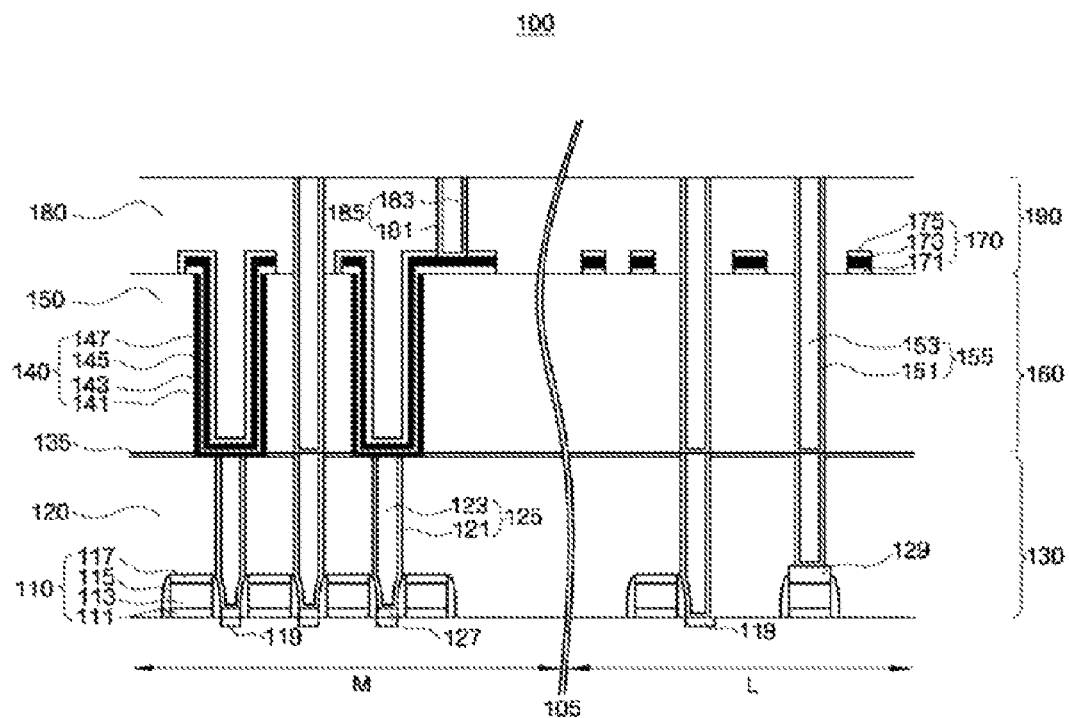
FIGS. 1A and 1B are sectional views illustrating an MML semiconductor device according to embodiments of the present invention.

The present invention and methods of accomplishing the same may be understood more readily by reference to the following detailed description of preferred embodiments and the accompanying drawings. The present invention may, however, be embodied in many different forms and should not be construed as being limited to embodiments set forth herein. Rather, embodiments are provided so that this disclosure will be thorough and complete and will fully convey the concept of the invention to those skilled in the art, and the present invention will only be defined by the appended claims. In the drawings, the shape and thickness of layers and regions are exaggerated for clarity. Like reference numerals refer to like elements throughout the specification.

An exemplary embodiment of the present invention will be described with ideal illustrations such as sectional views and plan views. The illustration can be modified according to a fabricating technology and/or permitted error limitations. Therefore, exemplary embodiments of the present invention are not limited by the illustration, and include shape variations according to the fabrication process. Therefore, regions shown in the figures are illustrated in schematic forms, and the shapes of the illustrated regions in the figures are presented simply by way of illustration and not as a limitation.

According to an embodiment of the present invention, an MML semiconductor device includes a logic device including a memory device, a logic circuit including a memory circuit, a memory device including a logic device, and a memory circuit including a logic circuit. The MML semiconductor device may include DRAM, FRAM, MRAM, PRAM, or other memory devices or circuit including a logic device or circuit.

Hereinafter, a structure of the MML semiconductor will be described with reference to drawings.

Figure 1B:
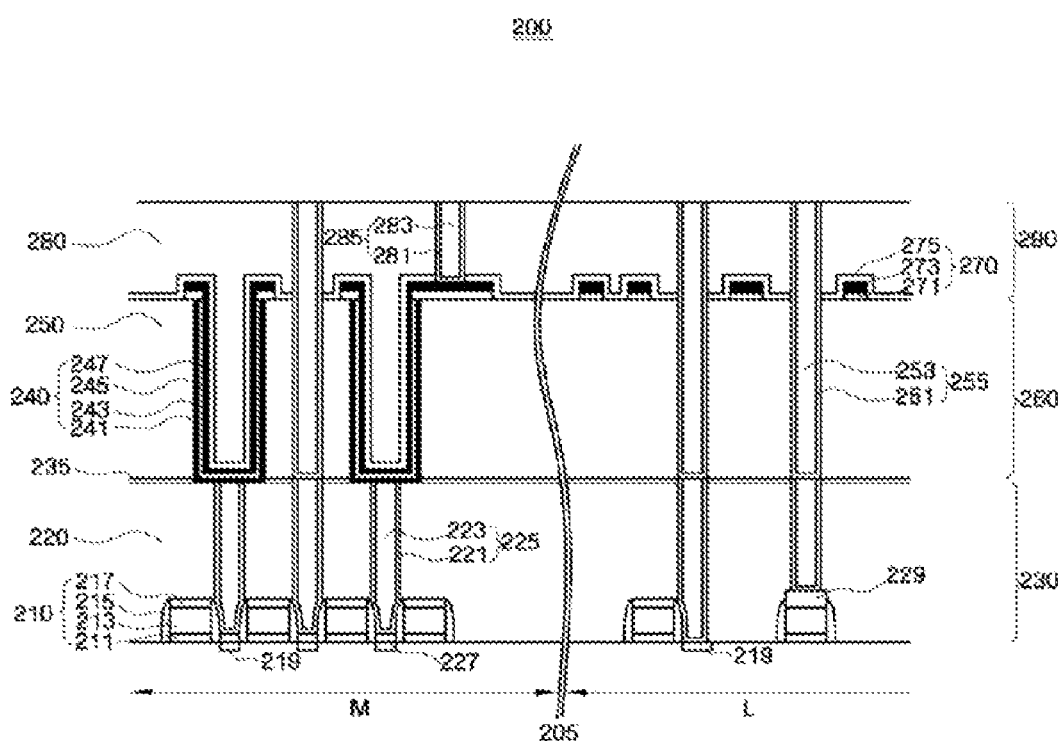

FIGS. 1A and 1B are sectional views illustrating an MML semiconductor device according to an exemplary embodiment of the present invention.

Referring to FIG. 1A, an MML semiconductor device 100 comprises a memory region M and a logic region L. The MML semiconductor device 100 includes a first circuit layer 130 comprising gates 110 formed on a substrate 105, source/drain regions 119 formed on both sides of the gates 110 in the substrate 105, silicide regions 127 on the source/drain regions 119, a first interlayer dielectric (ILD) layer 120 that covers the gates 110 and silicide regions 127, and first via plugs 125 which vertically penetrate the first ILD layer 120 and are selectively connected to the silicide regions 127. The MML semiconductor device 100 includes a second circuit layer 160 comprising a second ILD 150 formed on the first circuit layer 130, and capacitors 140 and second via plugs 155 which vertically penetrate the second ILD layer 150 and are selectively connected to the first via plugs 125. The MML semiconductor device 100 includes a third circuit layer 190 comprising planarization resistance patterns 170 formed on the second ILD layer 150, a third ILD layer 180 formed on the second ILD layer 150 and the planarization resistance patterns 170, and third via plugs which vertically penetrate the third ILD layer 180 and are selectively connected to top electrodes 145 or the second via plugs 155.

In the drawing, the memory region M of the MML semiconductor device is illustrated on the left side, and the logic region L of MML semiconductor device is illustrated on the right side.

According to an exemplary embodiment of the present invention, the substrate 105 can be one of a silicon substrate, a silicon-on-insulator (SOI) substrate, and a SiGe substrate. In the case of the SiGe substrate, the substrate includes SiGe formed only on source/drain regions. A detailed description of the substrate is omitted since it is well known technology. Thus, exemplary embodiments using various semiconductor substrates are considered to be included in the technical range of the present invention.

The source/drain regions 119 are formed in the substrate 105 to enable gates 110 to operate as transistors. The source/drain regions 119 are formed by doping N-type impurities or P-type impurities. Methods to form the source/drain regions 119 are well known and detailed descriptions are omitted. Thus, exemplary embodiments using various types of the source/drain regions 119 are considered to be included in the technical range of the present invention.

The gates 110 include a gate dielectric layer 111, a conductive gate electrode 113, an insulating gate-capping layer 117, and an insulating gate spacer 115. Dielectric materials including silicon oxide can be used for the gate dielectric layer 111, however, gate dielectric layer is not limited thereto.

While the gate electrode 113 is shown in the drawing as a pattern composed of a single material, it can be formed in more than two layers using multiple layers of materials. The gate electrode 113 is formed in multiple layers, though, because all the layers are conductive materials it is shown as a single layer to aid understanding of the present invention and to avoid complicating the drawing. Thus, the gate electrode 113 formed in multiple layers is considered to be included in the technical concept range of the present invention.

The gate capping layer 117 is formed on the gate electrode 113 to substantially prevent the first ILD layer 120 from having direct contact with the gate electrode 113, and can also protect the gate electrode 113 during a manufacturing process. The gate capping layer 117 substantially prevents the gate electrode 113 from being exposed during manufacturing process.

The gate spacer 115 is on the side of the gate electrode 113 to substantially prevent the first ILD layer 120 from having direct contact to the gate electrode 113, and can protect the side of the gate electrode 113 during the manufacturing process. The gate spacer 115 can be formed and removed during the manufacturing process. In a case where the gate spacer 115 is removed, other dielectric layer can be formed on the side of the gate electrode 113. For example, the dielectric layer such as silicon oxide can be formed between the gate electrode 113 and the first ILD layer 120. In a case where gate spacer 115 is removed and another dielectric layer is formed, it can have a shape similar to the gate spacer 115 such that the width is uniform from an upper part to a lower part. Thus, even though the gate spacer 115 is depicted in the drawing, the gate spacer 115 can be removed and another side dielectric layer can be formed.

Additionally, the gate electrode 113 can be selectively connected to the first via plugs 125. When the gate electrode 113 is connected to the first via plug 125, a gate silicide layer 129 can be formed between the two layers. In the drawing, although the gate electrode 113 and the first via plugs 125 are selectively connected only in the logic region L, this is a simplification to aid understanding of the present invention. Thus, the gate electrode 113 formed in the logic region L as well as the gate electrode 113 formed in the memory region M can be selectively connected to the first via plugs 125.

Additionally, various types of gates such as FIN gates and recessed channel gates can be applied.

In other exemplary embodiments, the silicide regions 127 can be a landing pad which are conductive regions formed higher than the surface of the substrate 105. In a case implementing poly-silicon landing pads, the landing pads can be formed by selectively exposing a silicon surface of the substrate 105 and performing an epitaxial process.

The first via plugs 125 are conductive materials that are formed by vertically penetrating the first ILD layer 120. The first via plugs 125 can be formed using metals including tungsten, titanium, aluminum, and copper, but the via plugs are not limited to such materials. The first via plugs 125 transfer electric signals vertically by having connections to the source/drain regions 119 formed in the substrate 105, the silicide regions 127, 129, or the gate electrode 113.

The first via plugs 125 can include a liner layer 121 at the interface between the first ILD layer 120 and the source/drain regions 119, or the first ILD layer 120 and the gate electrode 113. The liner layer 121 substantially prevents atom or ion diffusion between the different layers. The liner layer 121 can be formed using Ti/TiN, but is not limited thereto.

The silicide regions 127 can be formed in the area where the first via plugs 125 are connected to the source/drain regions 119 or the gate electrode 113. The silicide regions 127 can be formed by forming one or more metal layers of various metals including cobalt, titanium, and nickel on the exposed silicon surface followed by performing a heat treatment to induce silicidation. Nickel silicide regions using nickel can maintain the height of the silicon surface before silicidation. When the nickel silicide region is formed, the regions illustrated as the source/drain regions 119 in the drawing can be considered as the nickel silicide region.

The first ILD layer 120 can be formed by covering the substrate 105, the silicide regions 127 in the substrate 105, and the gates 110 and filling in the space between the first via plugs 125. The first ILD layer 120 can be formed using, for example, silicon oxide. Silicon oxide can be at least one selected from the group consisting of BPSG, BSG, PSG, FSG, USG, NSG, FOX, TEOS, and HDP-Ox.

A capping layer 135 can be formed on the first ILD layer 120. The capping layer 135 can be formed in a single layer or multiple layers. In FIG. 1A the capping layer of the first ILD layer 135 is depicted as being formed as a single layer using silicon nitride, but is not limited to such structure.

The second ILD layer 150 is formed on the first ILD layer 120 and can be formed using the same material as the first ILD layer 120. Although not illustrated, the capping layer 135 can be formed on the second ILD layer 150.

The capacitors 140 can be formed by vertically penetrating the second ILD layer 150. The capacitors 140 can be formed by vertically penetrating the second ILD layer 150 such that a capacitor bottom electrode 141 is selectively connected to the first via plugs 125. The capacitors 140 may be made in the form of a trench or hole, but not limited to such forms. The capacitor bottom electrode 141 can be formed using metal, and may not extend to a top of the second ILD layer 150. A capacitor dielectric layer 143 is formed on top of the bottom electrode 141. The capacitor dielectric layer 143 can be formed on a top and sides of the capacitor bottom electrode 141 to substantially prevent the capacitor bottom electrode 141 from being exposed. A capacitor top electrode 145 is formed on the capacitor dielectric layer 143. The capacitor dielectric layer 143 and the capacitor top electrode 145 can be extended up to the top of the second ILD layer 150. A capacitor capping layer 147 can be formed on the capacitor top electrode 145. The capacitor capping layer 147 can also be extended to the top of the second ILD layer 150.

The planarization resistance patterns 170 can be formed in the logic region L of the MML semiconductor device 100. Also, planarization resistance patterns 170 can be formed in multiple layers. For example, a lower resistance pattern or a first resistance pattern 171, an upper resistance pattern or a second resistance pattern 173, and a third resistance pattern 175 can be stacked in order to form the planarization resistance patterns 170. In this specification, terms of the upper resistance pattern and the lower resistance pattern are used to indicate a position of the two patterns relative to one another. The terms of the first resistance pattern 171, the second resistance pattern 173, and the third resistance pattern 175 are used hereinafter.

The third resistance pattern 175 can be formed in multiple layers. For example, it can be formed by stacking a silicon oxide layer and a silicon nitride or silicon oxynitride layer. Although the third resistance pattern 175 is illustrated in a single layer to aid understanding of the present invention, the third resistance pattern 175 can be formed in multiple layers. The silicon oxide layer can be formed using a plasma method to a thickness of about 300 Å and a silicon oxynitride layer can be formed using a vapor deposition method to a thickness of about 260 Å. The values of the thickness are examples and not limiting. Further, the planarization resistance patterns 170 may be formed using various material layers.

The planarization resistance patterns 170 can be formed of the same materials as the capacitor dielectric layer 143, the capacitor top electrode 145, and the capacitor capping layer 147. The planarization resistance patterns 170 can be formed simultaneously during the formation of the capacitors 140. The planarization resistance patterns 170 are formed such that they are separated from one another by via plugs 155, such that a distance between adjacent planarization resistance patterns 170 is at least a horizontal width of the via plugs 155. The space between the planarization resistance patterns 170 and the via plugs 155 can affect a stable pattern formation and a process margin. The planarization resistance patterns 170 are conductive since the second resistance pattern 173 is made of the same material as the capacitor top electrode 145. In the drawing, the planarization resistance patterns 170 are shown as a single island pattern. However, in the top view of the drawing, the via plugs 155 are island patterns and the planarization resistance patterns 170 can be mainland patterns. If the planarization resistance patterns 170 are electrically coupled with the via plugs 155, the semiconductor device may not operate or may introduce malfunctions.

Therefore, a semiconductor device needs to be designed such that the planarization resistance patterns 170 are not electrically coupled with the via plugs 155 with an appropriate process margin. The planarization resistance patterns 170 are formed such that they are separated from the via plugs 155 by the horizontal width of the via plugs 155. However, this is one exemplary embodiment and should not limit the range of the present invention. In practice, the planarization resistance patterns 170 can be formed without manufacturing difficulties and considerable electrical coupling, such that they are separated from the via plugs 155 at a space of half of the horizontal width of the via plugs 155. The planarization resistance patterns 170 are depicted to be separated from the via plugs 155 by the horizontal width of the via plugs 155 to simplify the pattern design and to show an exemplary implementation where the patterns are substantially the same size.

The third ILD layer 180 can be formed using the same material that is used to form the first ILD layer 120 or the second ILD layer 150. A capping layer (not shown) can be formed on the third ILD layer 180 such as the capping layer of the first ILD 135.

The second via plug 155 and the third via plug 185 can be formed by performing a single process. Although the second via plug 155 can be formed prior to the formation of the third via plug 185, they can also be formed in a single process. When the third via plug 185 is formed after the second via plug 155 is formed, a liner layer (not shown) can be formed at the interface between the second via plug 155 and the third via plug 185. At this time, the interface between the second via plug 155 and the third via plug 185 can have the same or a similar height as the surface height of the second ILD 150.

The third via plug 185 can be connected to the capacitor top electrode 145. The third via plug 185 can be connected to the capacitor top electrode 145 by penetrating the capacitor capping layer 147. The third via plug 185 is connected to the capacitor top electrode 145 so that a device voltage, for example, a ground voltage can be applied.

Each of the third via plugs 185 is connected to a conductive signal transfer line (not illustrated), and consequently connected to a pad, a bump, and a solder ball to complete the MML semiconductor device.

The first resistance pattern 171 of the planarization resistance patterns 170 can be formed of the same material as the capacitor dielectric layer 143, and the second resistance pattern 173 can be formed of the same material as the capacitor top electrode 145. Also, the third resistance pattern 175 can be formed of the same material as the capacitor capping layer 147.

Referring to FIG. 1B, in another exemplary embodiment of an MML semiconductor device, a capping layer 275 of the planarization resistance pattern 270 is formed such that it is extended up to a top of a second ILD layer 250 and covers sides of a first resistance pattern 271 and a second resistance pattern 273. Also, a capacitor capping layer 247 is formed such that it covers sides of a capacitor top electrode 245 and a capacitor dielectric layer 243. A planarization resistance patterns 270 illustrated in FIG. 1B can have superior planarization resistance capability compared to planarization resistance patterns 170 illustrated in FIG. 1A.

The first resistance pattern 271 of the planarization resistance patterns 270 can be formed of the same material as the capacitor dielectric layer 243, and the second resistance pattern 273 can be formed of the same material as a capacitor top electrode 245. Also, the capping layer 275 of the planarization resistance pattern 270 can be formed of the same material as the capacitor capping layer 247.

Hereinafter, a method of forming the MML semiconductor device according to exemplary embodiments of the present invention will be described with reference to drawings.

FIG. 2A through 2I are sectional views sequentially illustrating a method of fabricating an MML semiconductor device according to an embodiment of the present invention.

Figure 2A:
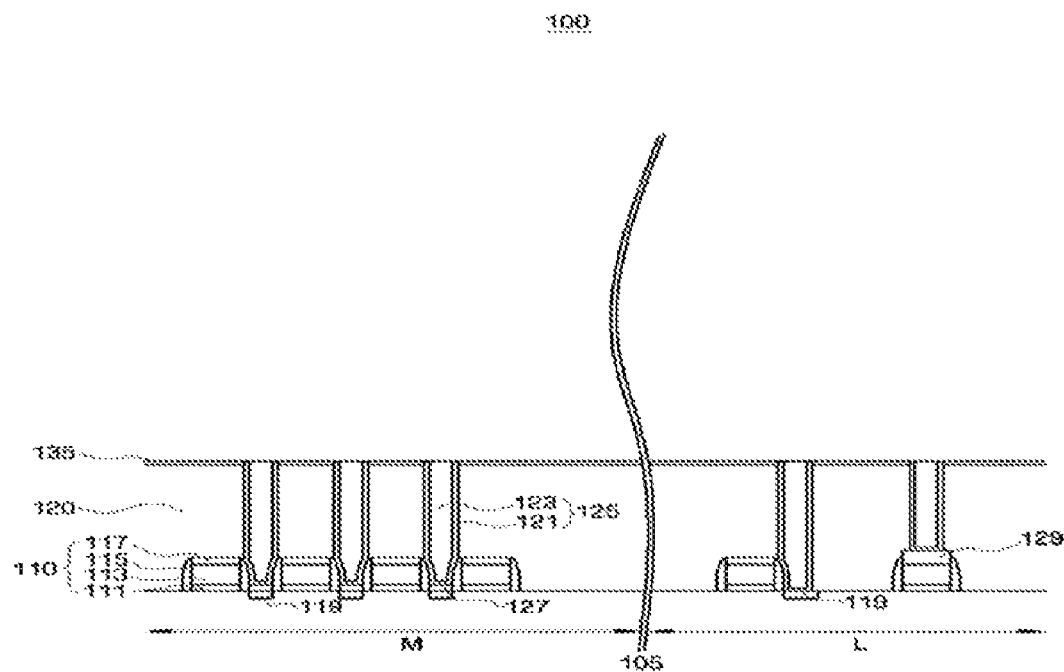
FIG. 2A through 2I are sectional views sequentially illustrating a method of fabricating an MML semiconductor device according to an embodiment of the present invention.

Referring to FIG. 2A, the gates 110 are formed on the substrate 105, source/drain regions 119, landing pads or silicide regions 127 are formed, the first interlayer dielectric (ILD) layer 120 which covers the substrate 105 and the gates 110 is formed, the capping layer 135 is formed on the first ILD layer 120, and first via plugs 125 which vertically penetrate the capping layer 135 and the first ILD 120, and are connected to the source/drain regions 119, the landing pad or the silicide regions 127 are formed.

The substrate 105 can be selected from, for example, a silicon substrate, an SOI substrate, an SOS substrate, and a SiGe substrate. In case of the SiGe substrate, only activation regions or the source/drain regions 119 can be selectively formed with SiGe in the SiGe substrate. An STI region can be formed in the substrate 105, which is not shown in the figures.

The gates 110 including the gate dielectric layer 111, the gate electrode 113, the gate capping layer 117 and the gate spacer 115. The gates 110 are formed by forming a dielectric layer on the substrate 105, forming a poly silicon layer on the dielectric layer, patterning the dielectric and poly silicon layers to form the gate dielectric layer 111 and the gate electrode 113, respectively, forming an insulating layer, and etching the insulating layer to form the gate spacer 115. The dielectric layer for forming the gate dielectric layer 111 can be formed using silicon oxide for example. Silicon oxide can be formed by performing oxidation or deposition. The gate electrode 113 can be multi-layered. In the case of the multilayered gate electrode 113, for example, a two layer structure of polysilicon or silicide, or a three layer structure of poly-silicon, silicide, or metal may be implemented. The manufacturing methods to form a multi layered gate electrode 113 are well known and detailed descriptions thereof are omitted.

According to an embodiment of the present exemplary, the gate capping layer 117 and the gate spacer 115 can be formed of silicon nitride. Methods to form the gate capping layer 117 and the gate spacer 115 are well known and a detailed descriptions thereof are omitted.

The gates 110 can be formed without the gate spacer 115. For example, after the source/drain regions 119 are formed with the gate spacer 115, the gate spacer 115 can be removed. For the gates 110 having the gate spacer 115 removed, another insulating layer can be formed on the sides of the gate dielectric layer 111 and the gate electrode 113. When the gate spacer 115 is removed after the gate dielectric layer 111 and the gate electrode 113 are formed, the insulating layer remains at the side of the gate dielectric layer 111 and the gate electrode 113. The insulating layer remaining at the side of the gate dielectric layer 111 and the gate electrode 113 has a uniform thickness.

The source/drain regions 119 can be formed by implanting relatively low density impurity ions before the gate spacer 115 is formed, and implanting relatively high density impurity ions after the gate spacer 115 is formed. The impurity implantation density can be varied depending on the characteristics of the semiconductor devices to be manufactured.

Figure 2B:
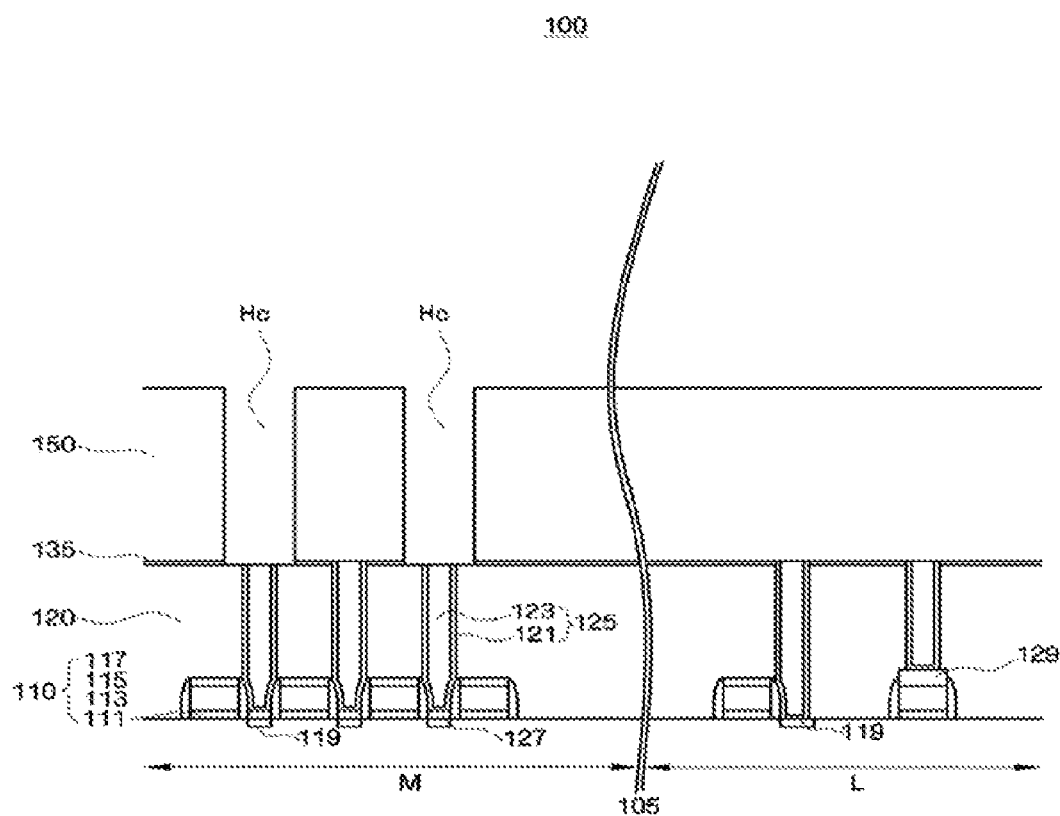

The silicide regions 127 and 129 are formed by combination of metal and silicon after forming metal layers including cobalt, titanium, or tungsten and heat treatment. The silicide regions 127, 129 may be formed higher than the surface to be formed. FIG. 2B shows that the silicide region 129 formed higher than the surface of the substrate 105 and the surface of the gate electrode 113.

The area indicated as the source/drain regions 119 can be a silicide area. In this case, the source/drain regions 119 can be a nickel silicide region. The nickel silicide is formed in the substrate 105 rather than on top of the substrate 105. Therefore, the nickel silicide is formed lower than the surface of the substrate 105 or the gate electrode 113, not on the surface of the substrate 105 or the gate electrode 113. In the case of forming nickel silicide, a nickel layer is formed in the region where a silicide layer is formed and another metal layer is formed on the surface of the nickel layer to form a nickel alloy layer. A heat treatment is applied to form the nickel silicide layer. The metal materials used in this case include platinum, and palladium. The silicide layer may be formed by having silicon atoms diffused into the metal layer. However, the silicide layer is formed by having nickel atoms diffused into the silicon layer. When the nickel silicide layer is formed by having nickel alloy layer that is formed by stacking the metal layer on top of the nickel layer, the unified and stable nickel silicide layer can be formed. In this case, the metal layer for the nickel layer and the nickel alloy layer can be formed by using electroless plating.

The silicide regions 127 can be landing pad regions. In case of the landing pad regions, the landing pads can be formed by selectively exposing the landing pad regions and performing epitaxial growth. The method of forming the landing pads using the epitaxial growth is well known and is therefore omitted here.

After forming the silicide regions 127 and 129, the first ILD layer 120 is formed. Referring to FIG. 2A, when the gates 110, the source/drain regions 119, and the silicide regions 127 are formed, insulating material is formed to have the same height as that of gate.

The first ILD layer 120 can be a silicon oxide such as a TEOS or an HDP-oxide layer, and it can be one or more layers. The first ILD layer 120 can be formed by filling or depositing silicon oxide. Methods for forming the first ILD layer 120 are well known and not described here.

The capping layer 135 is formed on the first ILD layer 120. The capping layer 135 can be formed of a deposited silicon nitride. Methods for forming the capping layer 135 are well known and not described here.

A photoresist pattern (not shown) which selectively exposes the first ILD layer 120 or the capping layer 135 of the first ILD layer 120 for forming a first via plugs 125, and first via holes (not shown) which expose the surface of the silicide regions 127 and 129 are formed by etching the capping layer 135 and the first ILD layer 120 using the photoresist pattern as an etch mask. The first via plugs 125 are formed by forming a liner layer 121 inside of the first via holes, filling a first via plug material 123, and performing a planarization process such as a CMP (chemical mechanical polishing).

Referring to FIG. 2B, a second ILD layer 150 is formed on the capping layer 135 of the first ILD layer 120 and the first via plugs 125. Capacitor holes Hc which vertically penetrate the second ILD layer 150 and selectively expose the top surface of the first via plugs 125 are formed to form capacitors. The second ILD layer 150 can be formed with the same material as the first ILD layer 120. The capacitor holes Hc are formed by a photolithography process, that is, a photoresist pattern for forming capacitor holes Hc is formed on the second ILD layer 150, and an etch process is performed.

Figure 2C:
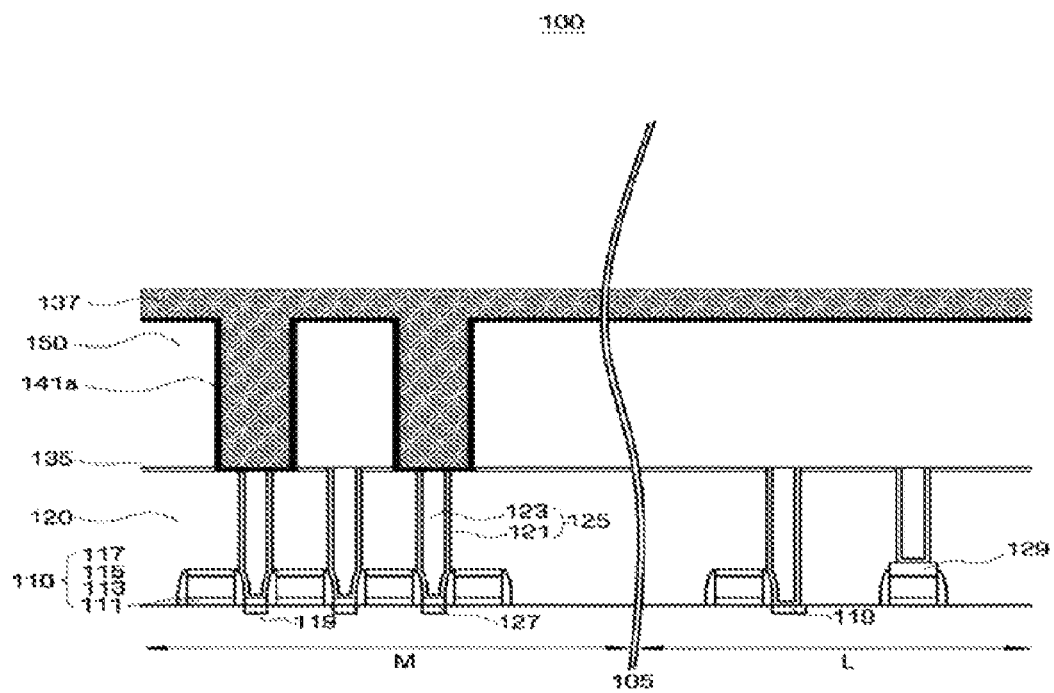

Referring to FIG. 2C, a capacitor bottom electrode material layer 141a for forming a capacitor bottom electrode 141 is formed inside the capacitor holes Hc and on the second ILD layer 150. A mask layer 137 for forming a capacitor bottom electrode 141 is formed on the capacitor bottom electrode material layer 141a. The capacitor bottom electrode material layer 141a is a metal layer, for example, Ti/TiN. The capacitor bottom electrode material layer 141a can be entirely formed by the electroless plating process. The mask layer 137 for forming the capacitor bottom electrode 141 is entirely formed. The mask layer 137 can be high molecular organic material such as photoresist or resin, or inorganic material such as silicon oxide.

Figure 2D:
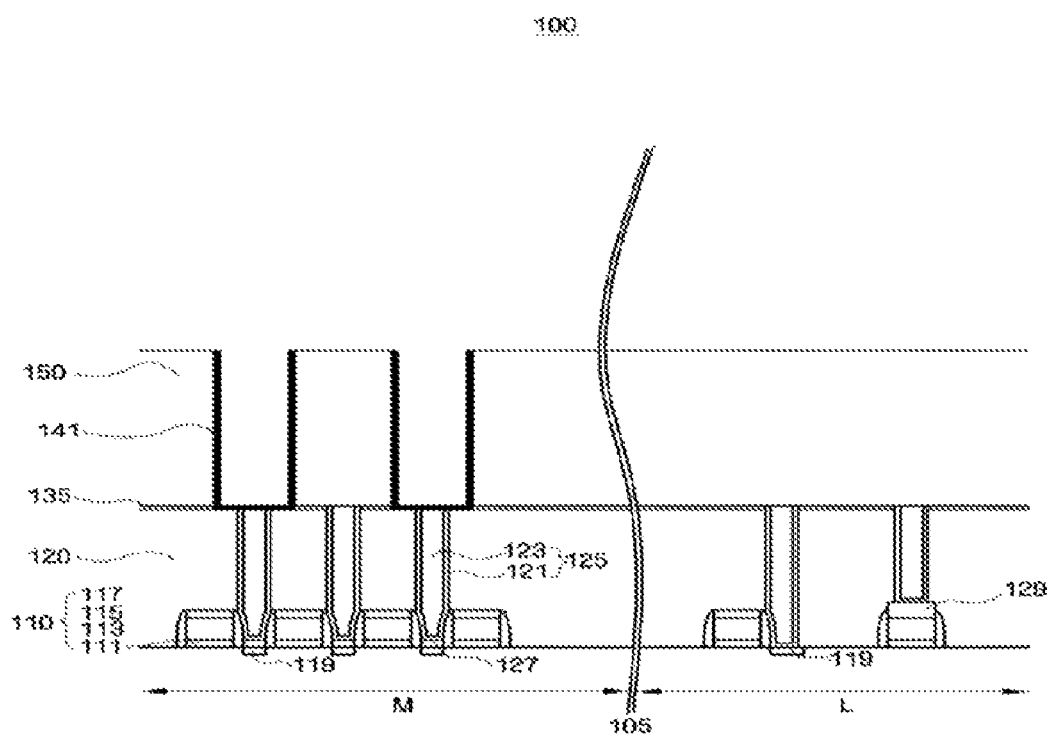

Referring to FIG. 2D, the capacitor bottom electrodes 141 are formed. The capacitor bottom electrodes 141 are formed by performing a blanket etch process or a CMP process such that material layer 141a for capacitor bottom electrode is processed for node separation. After the node separation, the mask layer 137 is removed. If the mask layer 137 is an organic material series, it can be removed by dry ashing using oxygen gas or wet etching using sulfuric acid, and if the mask layer 137 is an inorganic material series, for example, if the mask layer 137 is a silicon oxide, it can be removed by wet etching using fluoric acid.

Figure 2E:
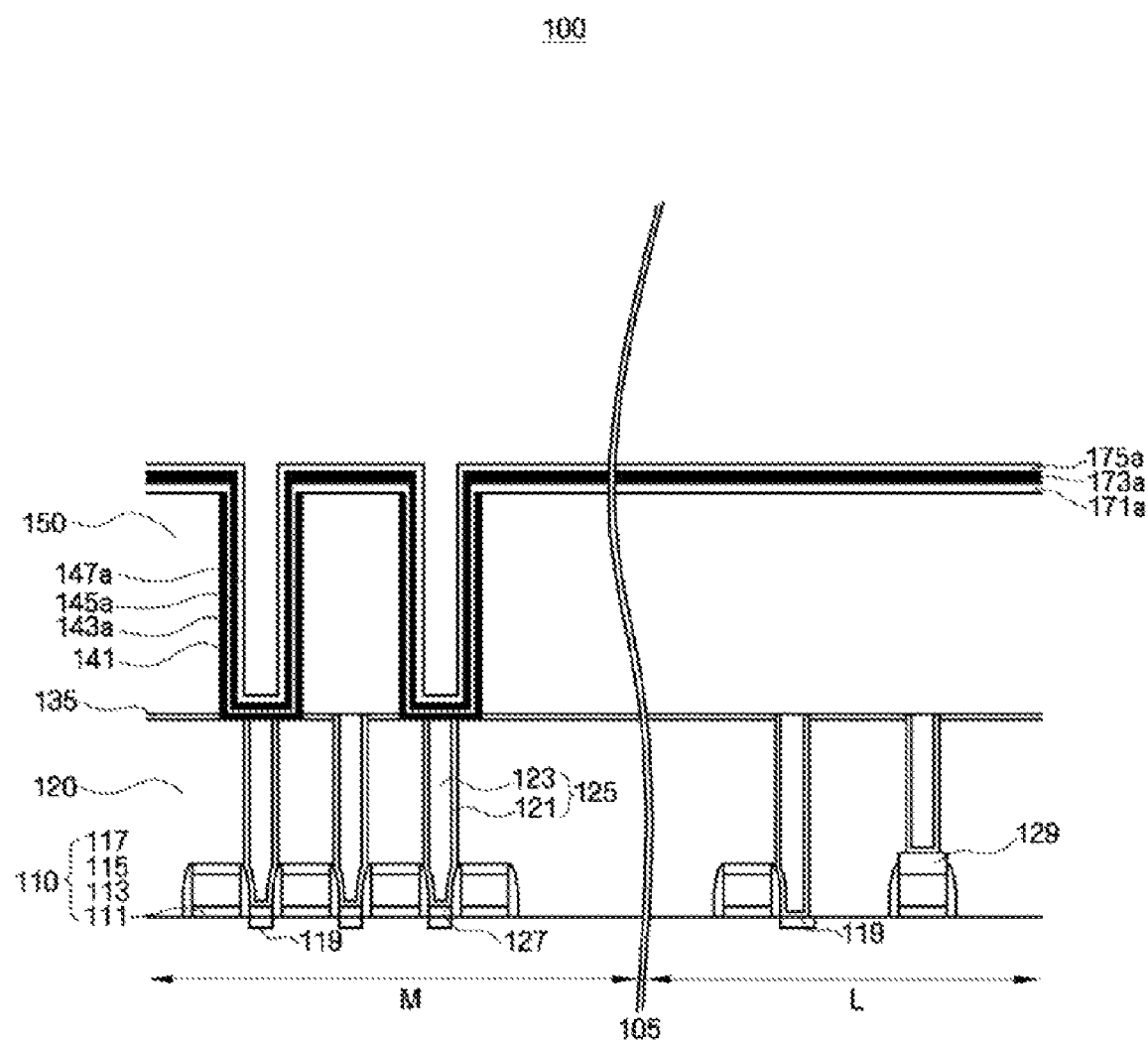

Referring to FIG. 2E, a capacitor dielectric material layer 143a for forming a capacitor dielectric layer 143 is formed, a capacitor top electrode material layer 145a for forming a capacitor top electrode 145 is formed, and a capacitor-capping material layer 147a for forming a capacitor-capping layer 147 is formed. At the same time, a first resistance pattern material layer 171a, a second resistance pattern material layer 173a, and the third resistance material layer 175a for forming planarization resistance patterns 170 are formed in a logic region L. The capacitor dielectric material layer 143a and the first resistance pattern material layer 171a can be formed at the same time, the capacitor top electrode material layer 145a and the second resistance pattern material layer 173a can be formed at the same time, and the capacitor capping material layer 147a and the third resistance pattern material layer 145a can be formed at the same time.

If the material layers for forming capacitors 143a, 145a, 147a and the material layers for forming planarization resistance patterns 171a, 173a, 175a are formed simultaneously, a separate process for forming the planarization resistance patterns 170 is not required.

Figure 2F:
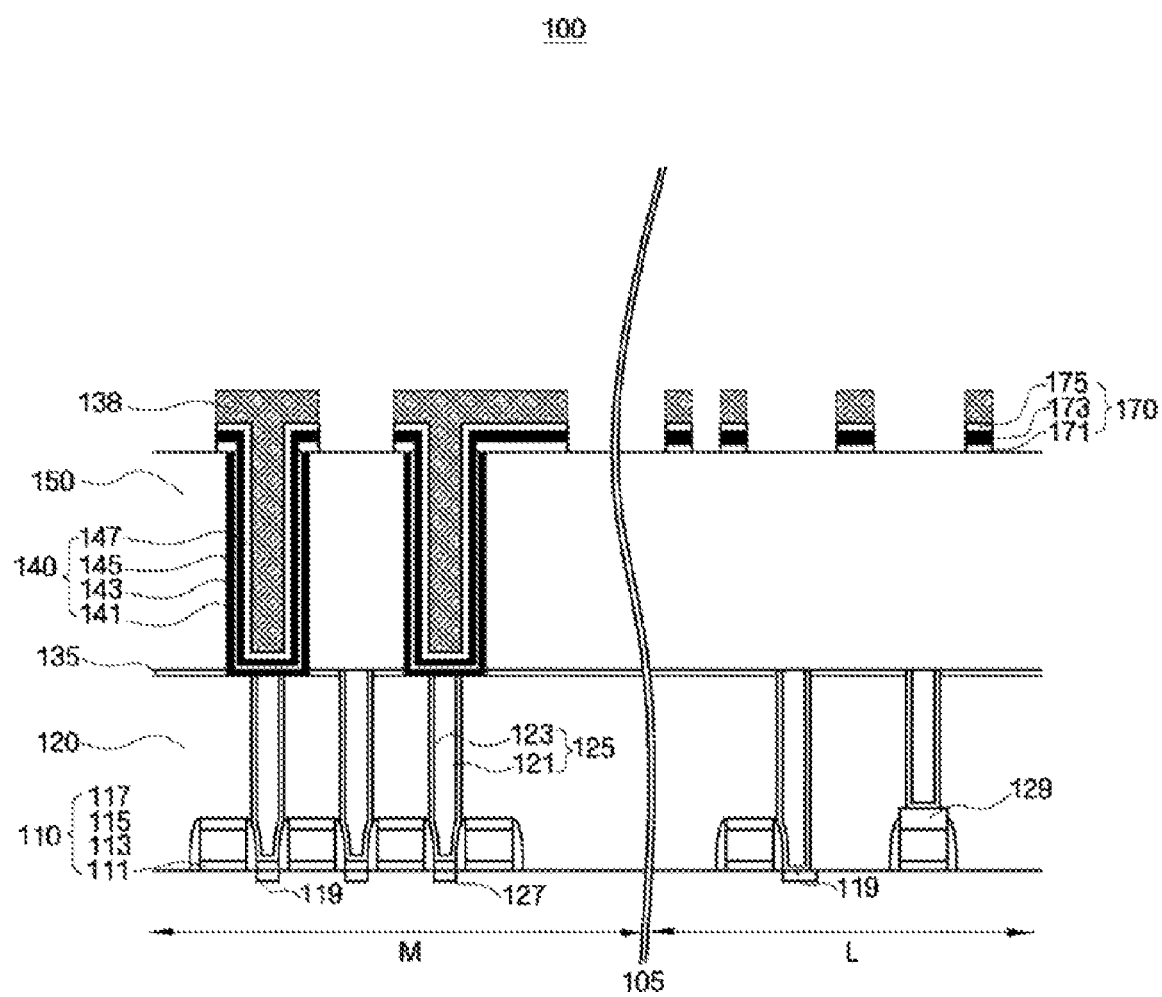

Referring to FIG. 2F, capacitors 140 and the planarization resistance patterns 170 are patterned by forming mask patterns 138 and performing an etching process. The mask patterns 138 can be photoresist patterns. The mask patterns 138 can be formed by performing a photolithography process, and the capacitors 140 and the planarization resistance patterns 170 can be formed by performing an etching process.

Figure 2G:
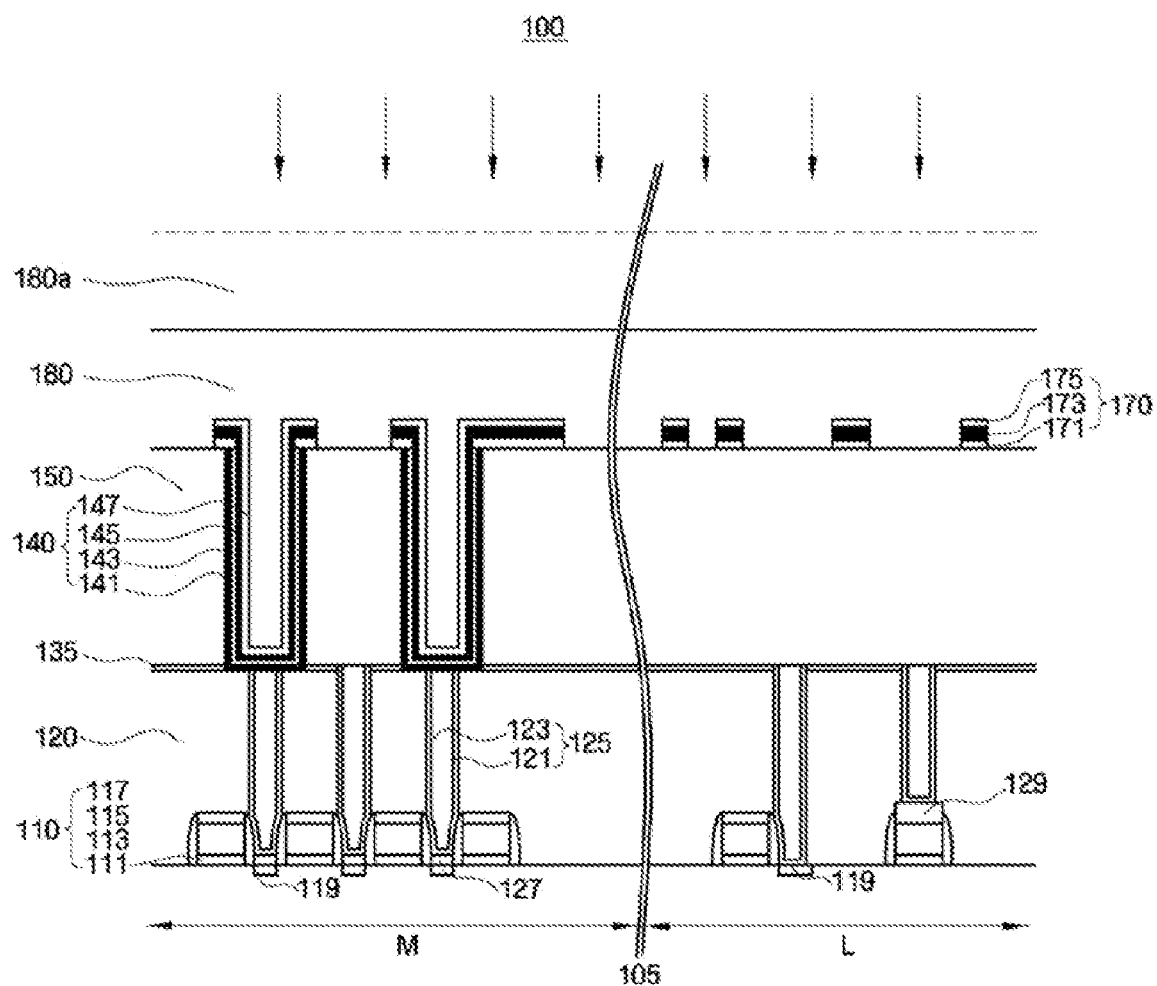

Referring to FIG. 2G, the third ILD layer 180 is formed by forming a thick dielectric layer 180a and performing a planarization process. A CMP process can be used for planarization process. The planarization resistance patterns 170 in the logic region L resist excessive polishing, so the third ILD 180 in the memory region M and in the logic region L can be formed to have uniform thickness and planarization. If the planarization resistance patterns 170 are not formed, the logic region L may become lower than the memory region M due to a dishing phenomenon. That is, the height difference of the third ILD 180 of the memory region M and the logic region L is high, e.g., on the order of about 1000 Å. If the height difference is high, a following interconnection process becomes unstable, and a focus margin is small in the photolithography process, therefore it is difficult to produce a stably working semiconductor device.

Figure 2H:
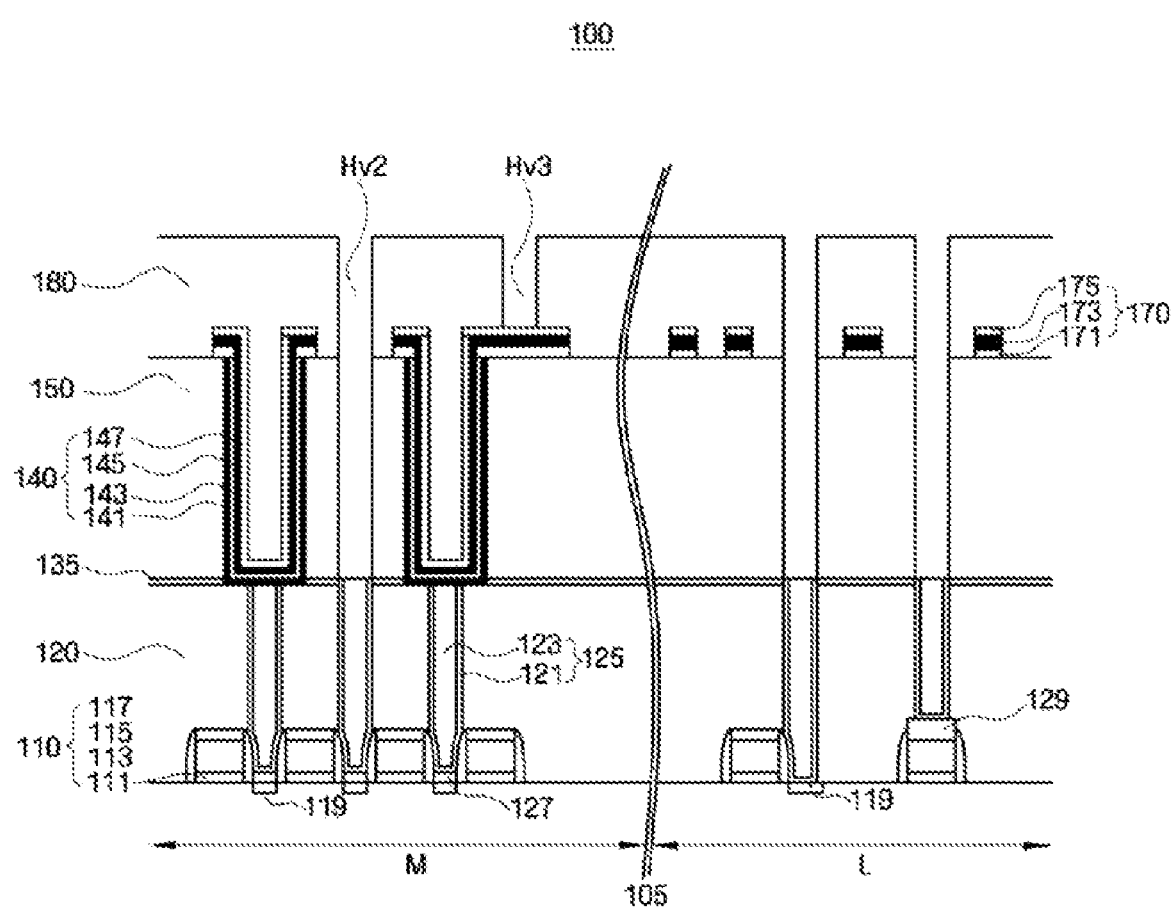

Referring to FIG. 2H, second via holes Hv2 and the third via holes Hv3, which are selectively connected to the first via plugs 125 and the top electrode 145 of the capacitors 140, respectively, are formed by vertically penetrating the third interlayer dielectric layer 180. The second via holes Hv2 and the third via holes Hv3 are formed by forming photoresist patterns (not shown) on the third ILD layer 180 using photolithography, and etching the third ILD layer 180. The second via holes Hv2 are formed such that their patterns are not overlapped with the planarization resistance patterns 170, and the second via holes Hv2 patterns are separated from the planarization resistance patterns 170 by a minimum space of about a horizontal width of the second via holes Hv2. The photoresist patterns are removed after the second via holes Hv2 and the third via holes Hv3 are formed.

Figure 2I:
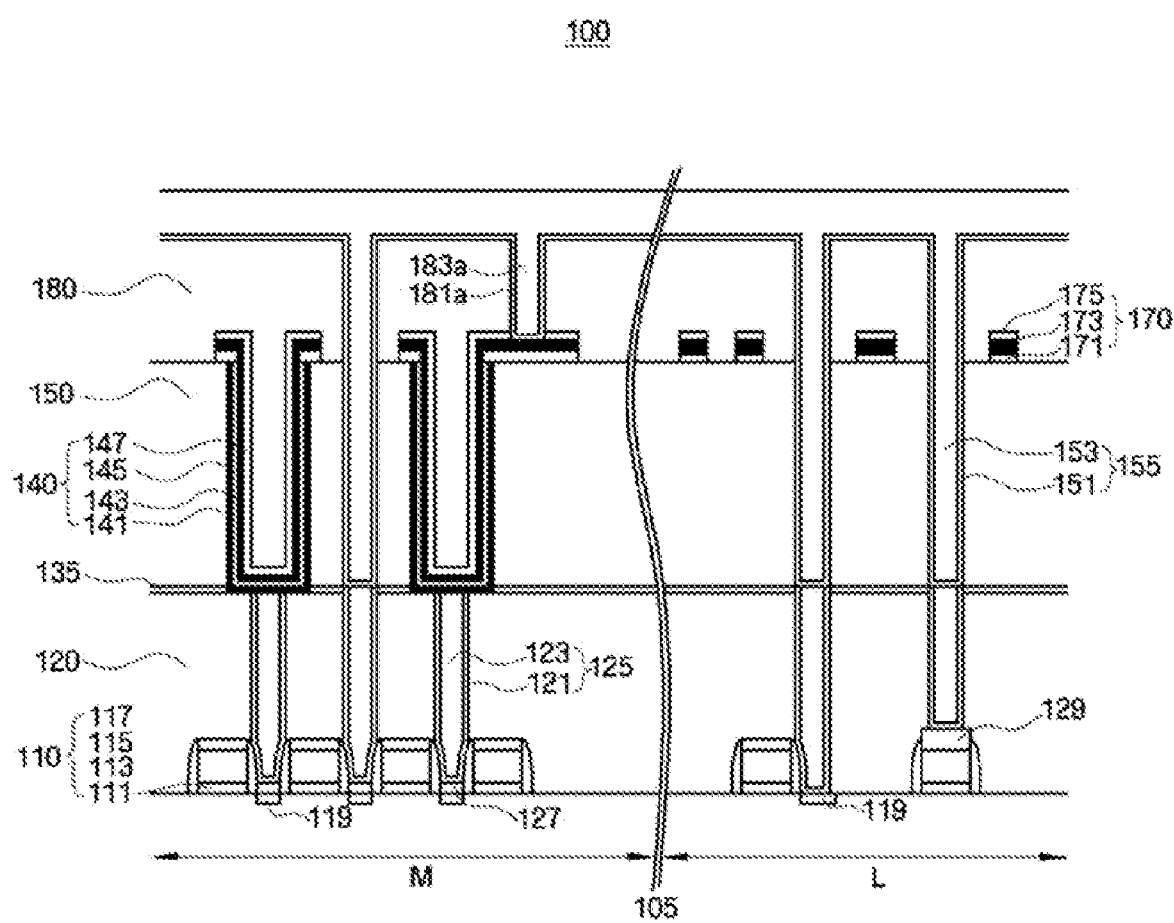

Referring to FIG. 2I, a second liner layers 151, 181 are formed the inside of the second via holes Hv2 and the third via holes Hv3. The inside of the second via holes Hv2 and the third via holes Hv3 are filled with a second via plug material 153 and a third via plug material 183. The second liner layer 151, 181 can be a Ti/TiN layer, and the second via plug material 153 can be a metal material including tungsten, metallic materials, etc. The node separation of each of the via plugs 185 is completed by performing a CMP process, and the MML semiconductor device illustrated in FIG. 1A is completed.

FIG. 3A through 3F are sectional views sequentially illustrating a method of fabricating an MML semiconductor device according to another embodiment of the present invention. In more detail, FIG. 3A through 3F are sectional views illustrating a method of fabricating the MML semiconductor device illustrated in FIG. 1B.

Figure 3A:
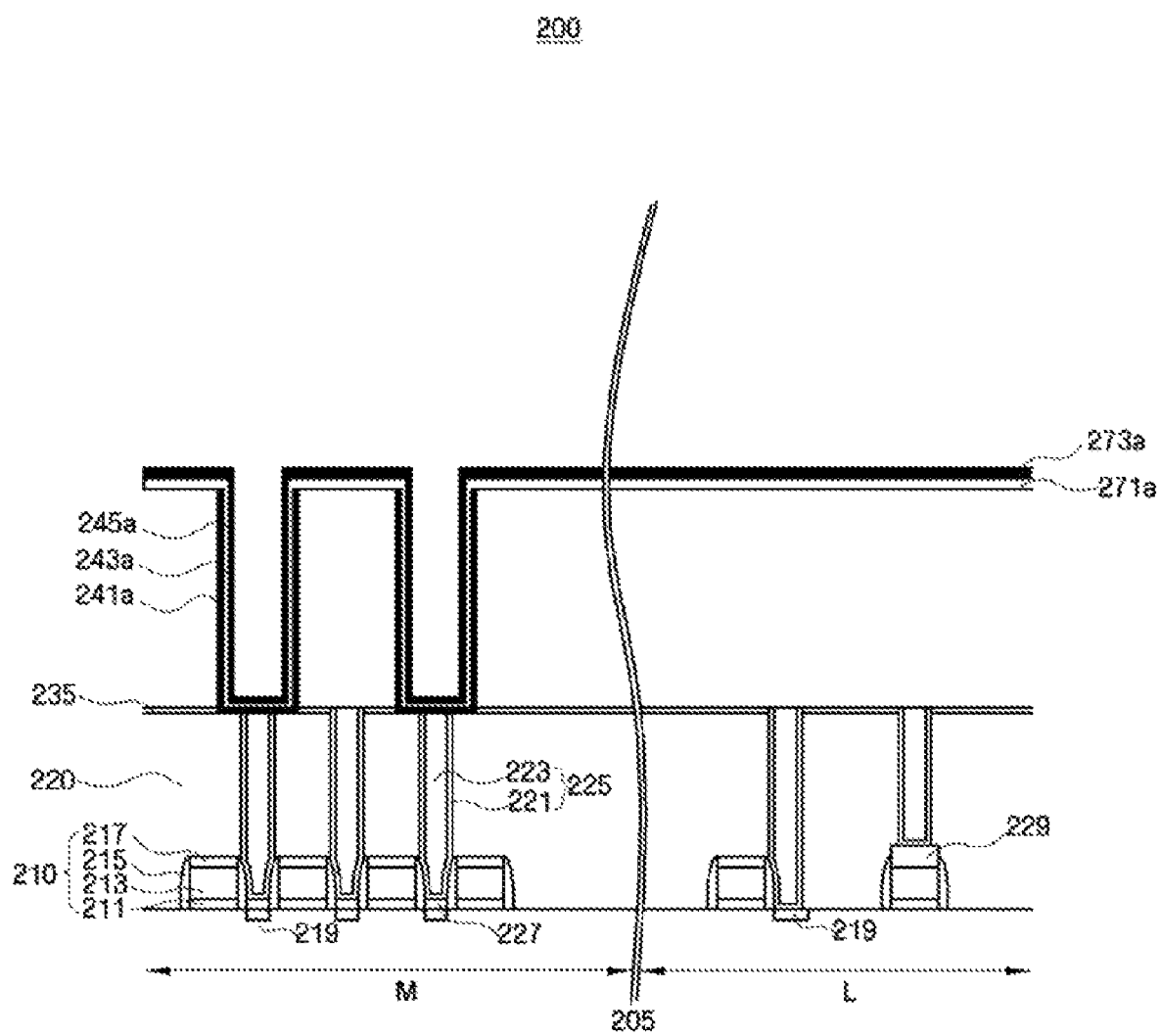
FIG. 3A through 3F are sectional views sequentially illustrating a method of fabricating a semiconductor device according to another embodiment of the present invention.

Referring to FIG. 3A, after the process illustrated in FIG. 2D, that is, after the bottom electrode 241 of the capacitor 240 is formed, a capacitor dielectric material layer 243a for forming a capacitor dielectric layer 243 and a capacitor top electrode material layer for forming a capacitor top electrode 245 of the capacitors 240 are formed.

Simultaneously, in the logic region L, a first resistance pattern material layer 271a and a second resistance pattern material layer 273a are formed to form planarization resistance patterns 270. The capacitor dielectric material layer 243a and the first resistance pattern material layer 271a can be formed simultaneously. Also, the capacitor top electrode material layer 245a and the second resistance pattern material layer 273a can be formed at the same time.

If the capacitor material layer 243a, 245a and the planarization resistance pattern material layer 271a, 273a are formed simultaneously, a separate process to form the planarization resistance patterns 270 is not needed.

Figure 3B:
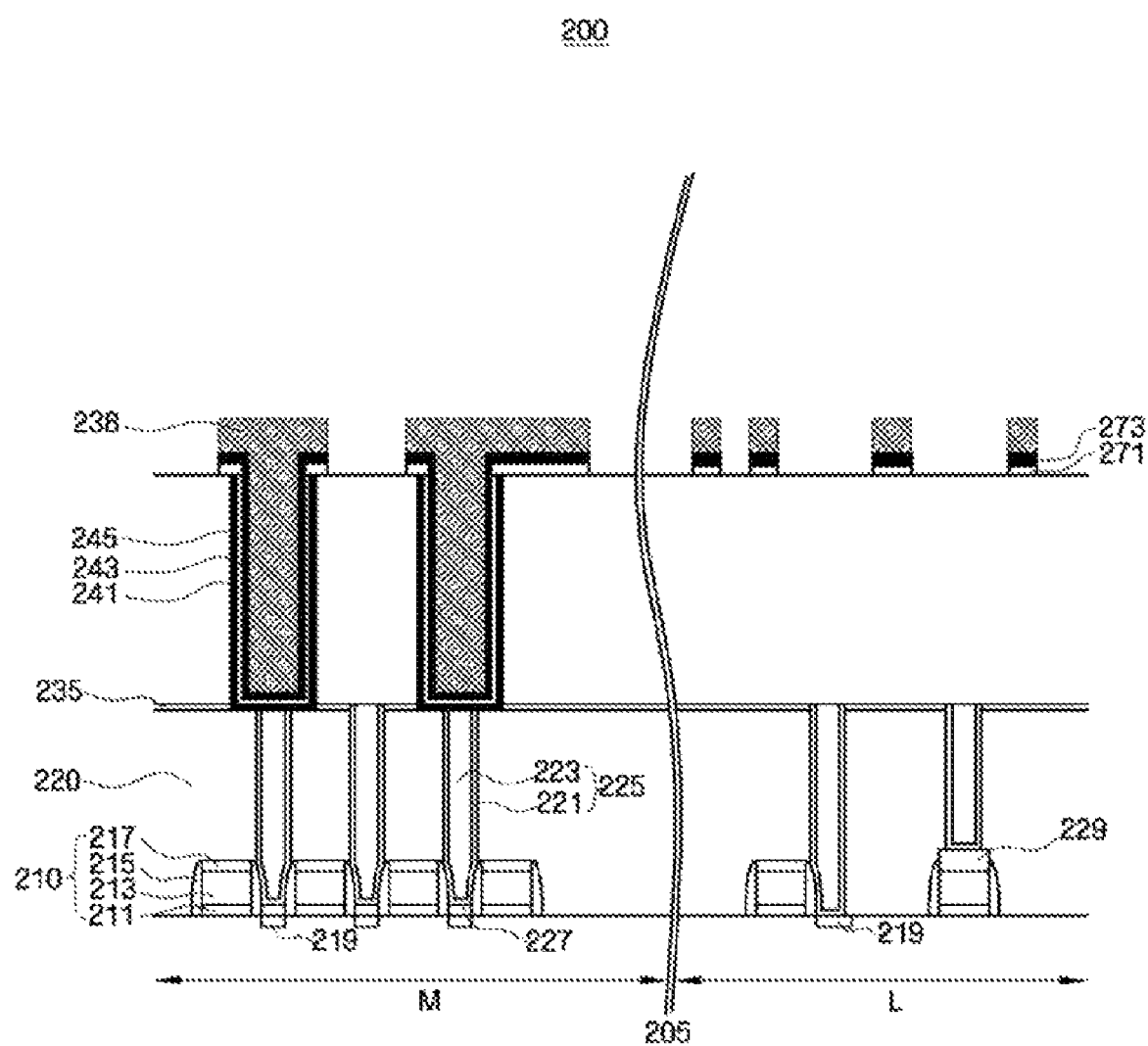

Referring to FIG. 3B, which refers to FIG. 2F, mask patterns 238 are formed to form the capacitors 240 and the planarization resistance patterns 270. An etching process is performed to pattern the capacitors 240 and the planarization resistance patterns 270. The mask patterns 238 can be, for example, photoresist patterns. The mask patterns 238 can be formed using a photolithography process, and the capacitors 240 and the planarization resistance patterns 270 can be formed using etching process.

Figure 3C:
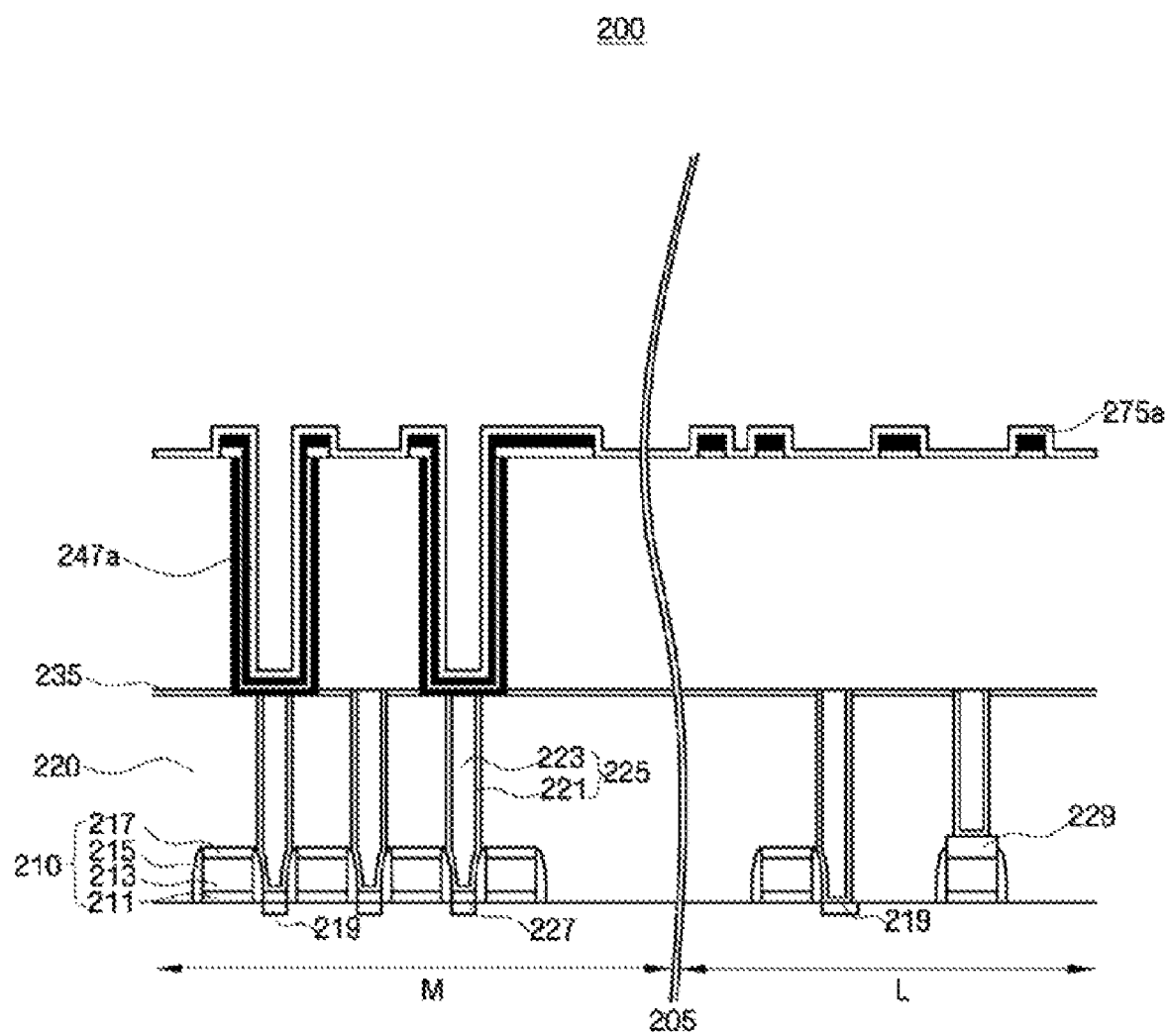

Referring to FIG. 3C, a capacitor capping layer 247 is formed in the memory region M, and a capping material layer 247a, 275a are formed to form a capping layer of the planarization resistance pattern in the logic region L. Silicon nitride can be formed using a deposition method.

The capacitor capping layer 247 and the capping layer of the planarization resistance pattern are multilayered. For example, they can be formed by stacking two or more layers including, for example, a silicon oxide layer, a silicon nitride layer, and a silicon oxynitride layer. In the drawing, the capping layer of the planarization resistance pattern is depicted to be formed in a single layer to aid understanding of the explanation of the present invention. The multilayered capacitor capping layer 247 or the capping layer of the planarization resistance pattern 275 may be considered to be included in the technical range of the present invention. In more detail, the silicon oxide layer is formed to a thickness of approximately 300 Å using a plasma method, and the silicon oxynitride layer can be formed to a thickness of 260 Å using a vapor deposition method.

Figure 3D:
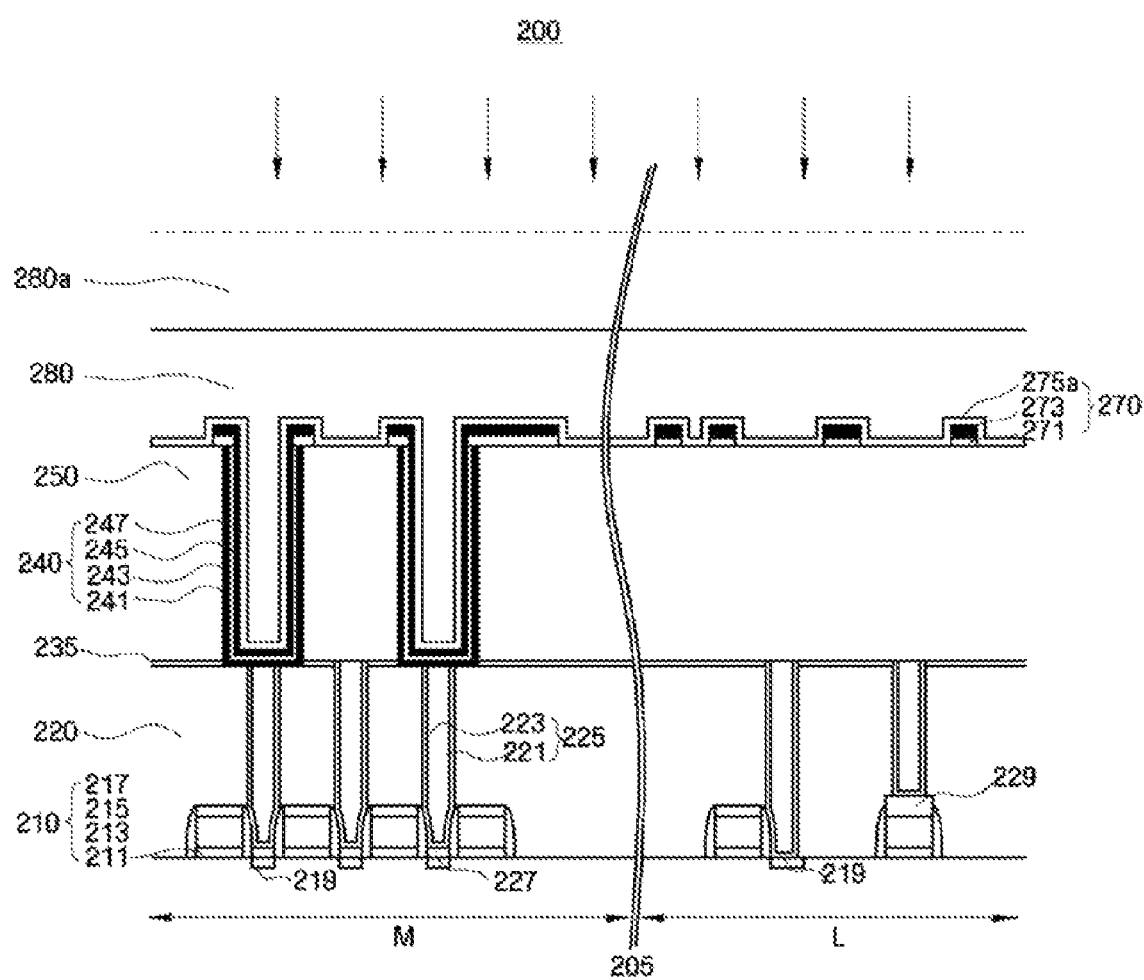

Referring to FIG. 3D, a thick dielectric layer 180a for forming a third ILD layer 280 are formed, and a planarization process is performed to form the third ILD layer 280. The planarization process can be performed by a CMP process. At this time, the planarization resistance patterns 270 and the capping layer of planarization resistance pattern 275a in Logic region L resist excessive polishing, thus the third ILD 280 in the memory region M and the logic region L can be formed to have uniform thickness by planarization. If the planarization resistance patterns 270 are not formed, the logic region L may be formed lower than the memory region M due to a dishing phenomenon. The height difference between the third ILD 280 of the memory region M and the logic region L is high, on the order of about 1000 Å. If the height difference is high, the following interconnection process becomes unstable, and a focus margin is small in the photolithography process, therefore it is difficult to produce a stably working semiconductor device.

Figure 3E:
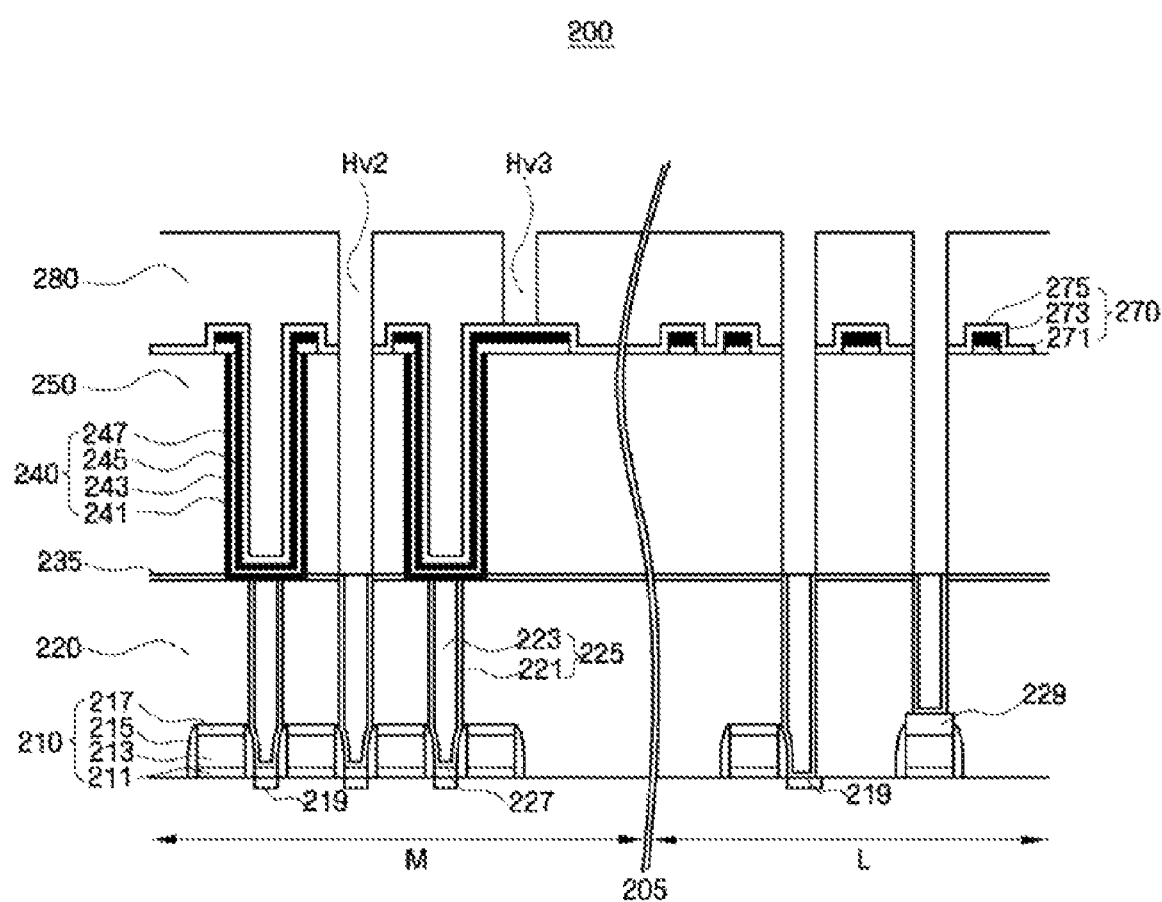

Referring to FIG. 3E, the second via holes Hv2 and the third via holes Hv3, which are selectively connected to a first via plugs 225 and the top electrode 245 of the capacitors 240, respectively, are formed by vertically penetrating the third ILD layer 280. The second via holes Hv2 and the third via holes Hv3 are formed by forming photoresist patterns (not shown) on the third ILD layer 280 using photolithography, and etching the third ILD layer 280. The second via holes Hv2 are formed such that their patterns are not overlapped with the planarization resistance patterns 270. The second via holes Hv2 patterns are separated from the planarization resistance patterns 270 with the minimum space of about a horizontal width of the second via holes Hv2. The photoresist patterns are removed after the second via holes Hv2 and the third via holes Hv3 are formed.

Figure 3F:
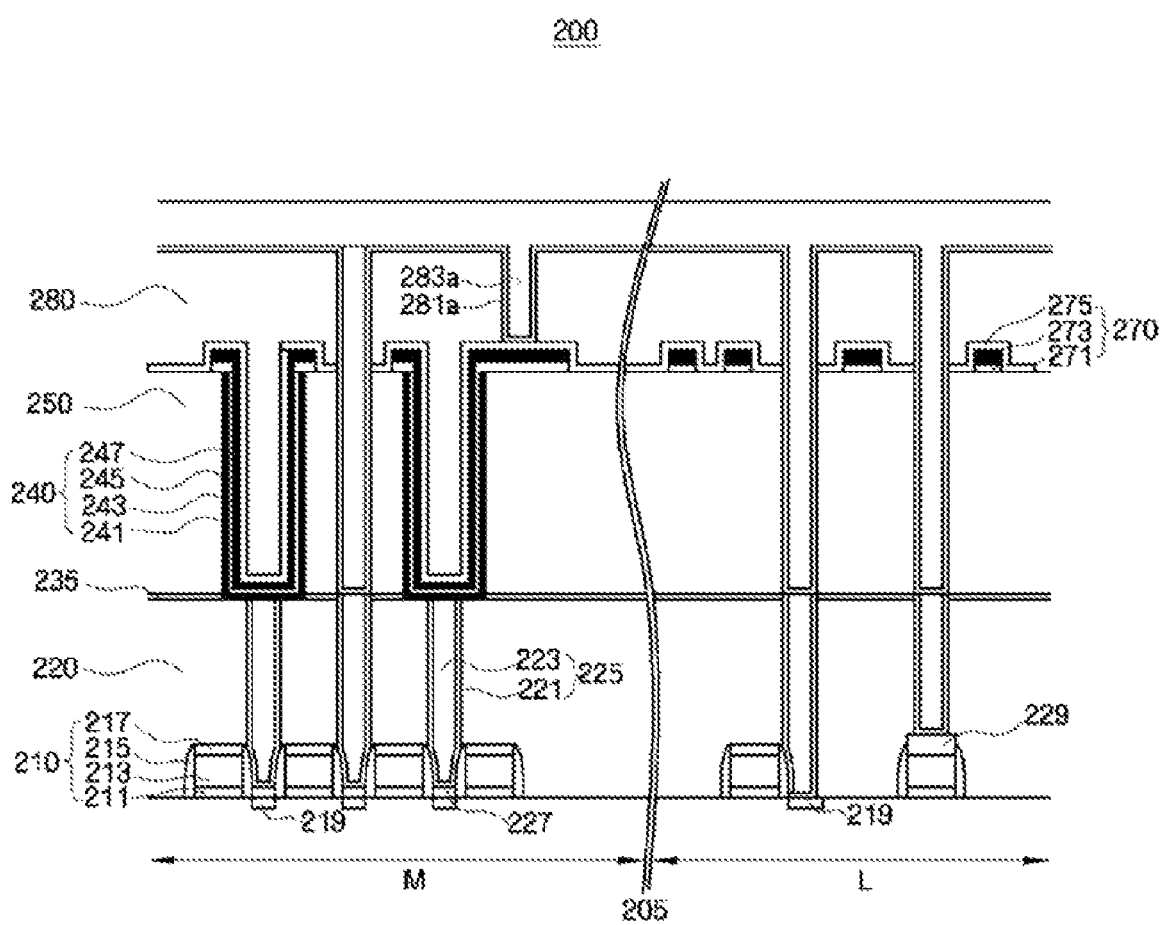

Referring to FIG. 3F, second liner layers 251, 281 are formed inside and on the bottom of the second via holes Hv2 and the third via holes Hv3. The inside of the second via holes Hv2 and the third via holes Hv3 are filled with a second via plug material 253 and a third via plug material 283. The second liner layer 251, 281 can be a Ti/TiN layer, and the second via plug material 253 can be tungsten or other metal. Node separation of each of the via plugs 285 are performing in a CMP process, and the MML semiconductor device illustrated in FIG. 1B is completed.

While the present invention has been particularly shown and described with reference to exemplary embodiments thereof, it will be apparent to those skilled in the art that the scope of the invention is given by the appended claims, rather than the preceding description, and all variations and equivalents which fall within the range of the claims are intended to be embraced therein. Therefore, it should be understood that embodiments are not limitative, but illustrative in all embodiments.

As described above, in a process to planarize a memory region and logic region, because the MML semiconductor device in exemplary embodiments of the present invention includes planarization resistance patterns in a logic region, which prevent excessive etching of logic region and polishing, uniform thickness and planarization in both memory region and logic region can be obtained. As a result, the manufacturing process of an MML semiconductor device is stabilized and an additional process is not needed since planarization resistance patterns can be simultaneously formed using the process to form memory region capacitors.

What is claimed is:

1. A merged memory with logic (MML) semiconductor device comprising:
   a substrate;
   gates formed on the substrate;
   a source region and a drain region formed on respective sides of each of the gates in the substrate;
   a first interlayer dielectric (ILD) layer which covers the gates and the source/drain regions;
   first via plugs which vertically penetrate the first ILD layer and selectively connect to the source/drain regions;
   capacitors and second via plugs selectively connected to the first via plugs;
   a second ILD layer fills between the capacitors and the second via plugs;
   planarization resistance patterns formed on the second ILD layer, wherein the planarization resistance patterns include an upper resistance pattern formed of a material used as a top electrode of the capacitors, and wherein the planarization resistance patterns include a lower resistance pattern formed of a material used as a dielectric layer of the capacitors, the upper resistance pattern and the lower resistance pattern being separated by a capacitor dielectric layer;
   a third ILD layer formed on the second ILD layer and the planarization resistant patterns; and
   third via plugs which vertically penetrate the third ILD layer, and selectively connected to the top electrode of the capacitors and the second via plugs.

2. The MML semiconductor device of claim 1, wherein the capacitors each comprise a bottom electrode, a dielectric layer, and the top electrode;
   the bottom electrode has the same height as the second ILD layer; and
   the dielectric layer and the top electrode are extended on the second ILD layer.

3. The MML semiconductor device of claim 2, wherein the substrate includes a memory region and a logic region, wherein
   the capacitors are formed in the memory region, and
   the planarization resistance patterns are formed in the logic region.

4. The MML semiconductor device of claim 1, further comprising a capping layer of the planarization resistance pattern formed on the upper resistance pattern.

5. The MML semiconductor device of claim 4, wherein the capping layer of the planarization resistance pattern is extended on the second ILD layer.

6. The MML semiconductor device of claim 1, wherein the third via plugs are separated from the planarization resistance patterns by a distance about equal to a horizontal width of the third via plugs.

7. The MML semiconductor device of claim 1, further comprising a capacitor capping layer formed on the top electrode of the capacitors.

* * * * *